(12) United States Patent
Hiltunen

(10) Patent No.: US 7,939,940 B2
(45) Date of Patent: May 10, 2011

(54) MULTILAYER CHIP SCALE PACKAGE

(75) Inventor: Jari Hiltunen, Mouhijarvi (FI)

(73) Assignee: OmniVision Technologies, Inc., Santa Clara, CA (US)

( * ) Notice: Subject to any disclaimer, the term of this patent is extended or adjusted under 35 U.S.C. 154(b) by 67 days.

(21) Appl. No.: 11/959,260

(22) Filed: Dec. 18, 2007

(65) Prior Publication Data

US 2009/0152720 A1    Jun. 18, 2009

(51) Int. Cl.
*H01L 29/72* (2006.01)

(52) U.S. Cl. ........ 257/738; 257/692; 257/698; 257/700; 257/748; 257/759; 257/762; 257/774; 257/780

(58) Field of Classification Search ............... 257/692, 257/698, 700, 738, 748, 759, 762, 774, 780
See application file for complete search history.

(56) References Cited

U.S. PATENT DOCUMENTS

| | | | |
|---|---|---|---|
| 6,949,408 B1 * | 9/2005 | Lin et al. | 438/107 |
| 2006/0234420 A1 * | 10/2006 | Yokozuka et al. | 438/106 |
| 2009/0093110 A1 * | 4/2009 | Lee et al. | 438/613 |

OTHER PUBLICATIONS

Lassen, Charles L., et al., "The Via Squeeze," IEEE Spectrum, Oct. 1999, pp. 36-41.
Rapala-Virtanen, Tarja, "Status and Future of HDI PWBs," (Abstract) This paper was presented in IEEE Conference in Atlanta on Jun. 3, 2002, pp. 1-8.
Corbett, Scott et al., "A High-Density, Resin-Coated-Foil (RCF) Substrate Utilizing Mask and Direct-Write UV Laser Photolithography," (Abstract) Presented at The International Conference and Exhibition on High Density Interconnect and Systems Packaging in Santa Clara, CA Apr. 20, 2001, 6 pages (unnumbered).
Ohsawa, Kenji et al., ISSCC 2001 Session 17/ TD: 3D Technologies and Measurement Techniques, 2 pages (unnumbered).

* cited by examiner

*Primary Examiner* — Edward Wojciechowicz
(74) *Attorney, Agent, or Firm* — Lathrop & Gage LLP

(57) ABSTRACT

A resin coated copper foil is used to fabricate a multilayer Chip Scale Package (CSP). A CSP package base has a first electrical routing layer. A resin coated copper foil is hot pressed onto the CSP package base and then patterned to form a second electrical routing layer. Conductive vias are then formed between the electrical routing layers. An Organic Solder Preservative (OSP) is used a surface finish for solder balls of the CSP.

12 Claims, 4 Drawing Sheets

MULTILAYER CHIP SCALE PACKAGE

FIELD OF THE INVENTION

The present invention is generally related to chip scale packaging. More particularly, the present invention is directed to multilayer chip scale packages having two or more electrical routing layers.

BACKGROUND OF THE INVENTION

A Chip Scale Package (CSP) is a type of integrated circuit carrier. There are various definitions for current generation CSP packages that are used in industry, such as the package having an area no greater than about 1.2 times the size of the die and/or the ball pitch being no greater than one millimeter. An interposer may be used with a CSP package. Alternatively, in some implementations the die is directly mounted to the CSP package.

One drawback of a CSP package is that it can place practical constraints on layout (pinout). This is because a CSP package typically includes a single metal routing layer to route electrical signals between a die and a motherboard. As a result, this constrains pinout. Multilayer CSP packaging approaches, while technically possible, raise serious manufacturing issues in terms of cost and reliability. A multilayer CSP package is potentially susceptible to a variety of manufacturing problems, such as ball shear, ball cracking, and de-lamination and cracking between different layers of routing.

Therefore, in light of the above-described problems the apparatus, system, and method of the present invention was developed.

SUMMARY OF THE INVENTION

A multilayer Chip Scale Package utilizes a resin coated copper foil to form at least one of the electrical routing layers in the package. A package base includes a first electrical routing layer on a surface of the package base. The resin coated copper foil is laminated to the surface and then patterned to form a second electrical routing layer. Conductive vias are then formed to provide electrical connections between the electrical routing layers. A laser drilling and a plating process may be used to form the electrical connections between the electrical routing layers. Additional process steps, such as the formation of a solder mask, are used to form a Ball Grid Array (BGA) of solder balls. An organic solder preservative may be used as a surface finish.

BRIEF DESCRIPTION OF THE FIGURES

The invention is more fully appreciated in connection with the following detailed description taken in conjunction with the accompanying drawings, in which.

Like reference numerals refer to corresponding parts throughout the several views of the drawings.

DETAILED DESCRIPTION OF THE INVENTION

Figure 1:
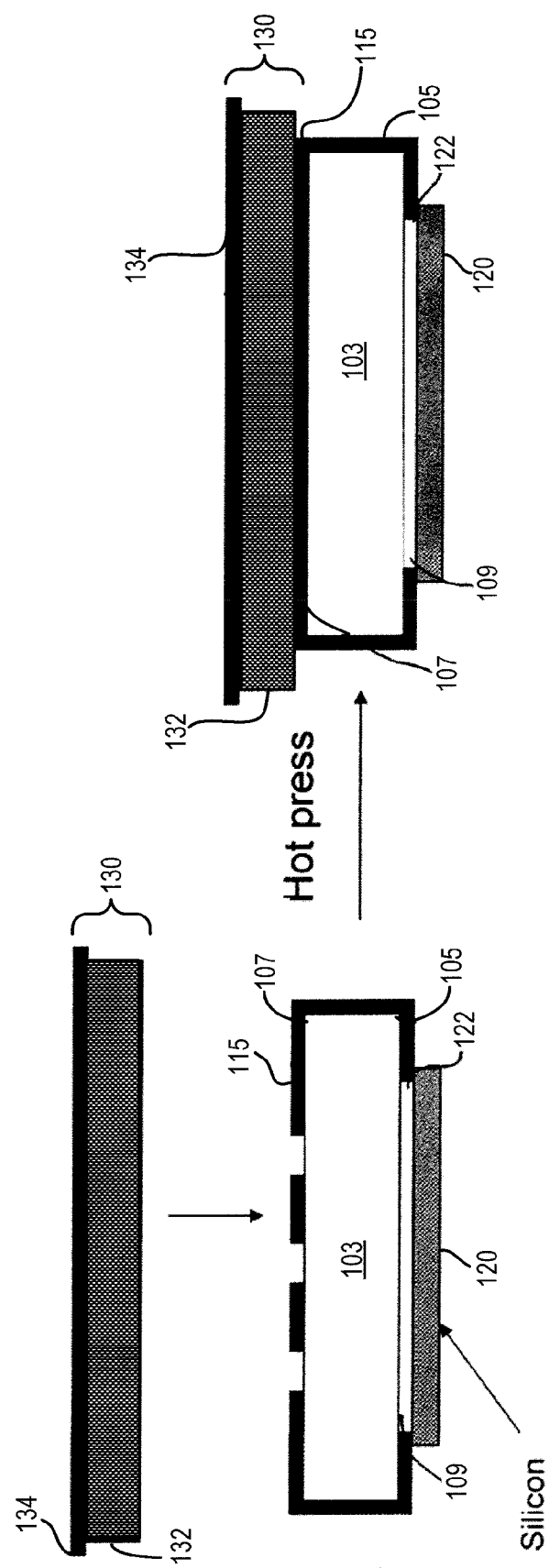
FIG. 1 illustrates lamination of a resin coated copper foil onto a first electrical routing layer in accordance with one embodiment of a chip scale package.

FIG. 1 illustrates an initial step of fabrication of a multilayer Chip Scale Package (CSP). A CSP package base 105 is provided. The CSP package base 105 includes an insulating layer 103 (e.g., a Chip Scale Module (CSM) glass). A first electrical routing layer 115 is formed on surface 107 of insulating layer 103 using conventional process steps such as depositing a conductive layer (e.g., a layer of a conductive metal), patterning the conductive layer, and forming electrical connections to the patterned conductive layer. A silicon wafer 120 is attached to the other side 109 of the CSP package base 105 to provide a substrate for bonding a die. Bond pads 122 are provided to form contacts between the first electrical routing layer 115 and the silicon wafer 120. The CSP package base 105 can be fabricated using conventional fabrication processes known in the packaging industry.

The present invention generally comprises, an apparatus, method, and product-by-process to use a Resin Coated Copper Foil (RCCF, also known as RCCu) to form at least one additional electrical routing layer. A RCCF 130 has a copper foil layer 134 and a resin layer 132. The resin layer 132 is an electrical insulator. The RCCF 130 is hot pressed to laminate the RCCF 130 to surface 107 of package base 105. An exemplary hot pressing process would be in a temperature range sufficient to cause the resin layer 132 to flow under pressure, such as a temperature range of 300-400° C. As illustrated in the right-side of FIG. 1, after the hot pressing operation is completed the resin layer 132 adheres to the package base 105 and embeds a portion of the first electrical routing layer 115 on surface 107. The copper foil layer 134 is thus separated from the first electrical routing layer 115 by the thickness of the layer of resin 132.

Figure 2:
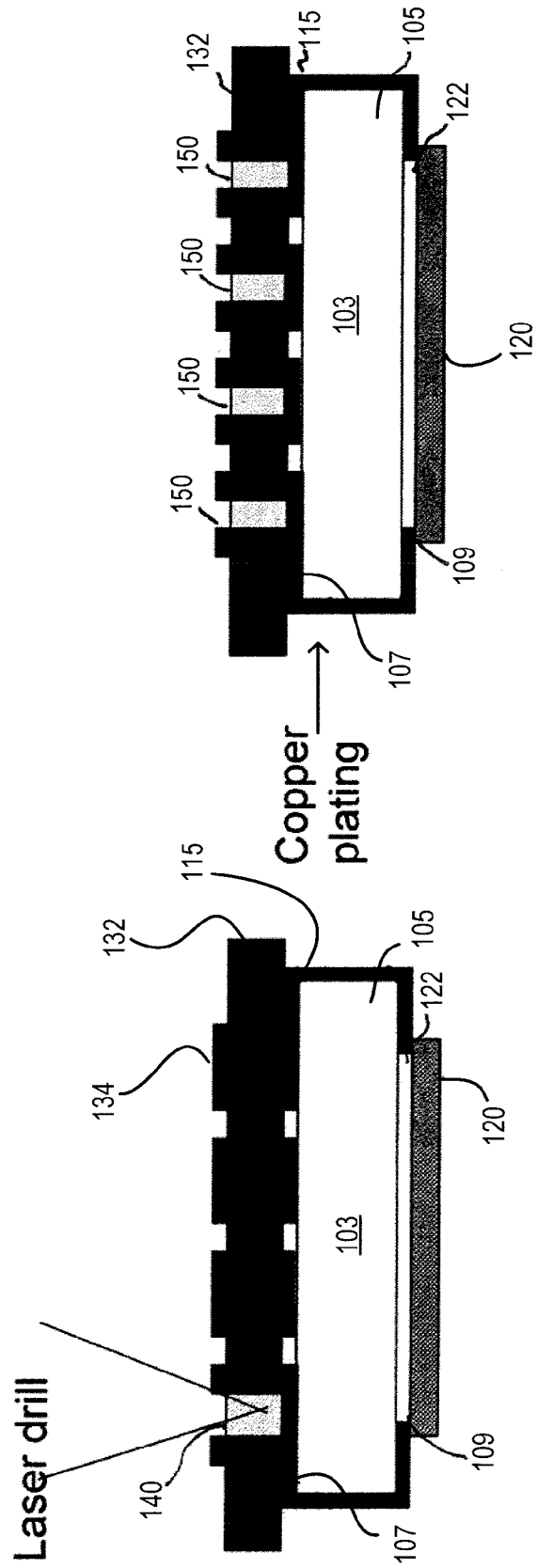
FIG. 2 illustrates formation of a second electrical routing layer on a foil layer of the resin coated copper foil in accordance with one embodiment of the present invention.

Referring to FIG. 2, the copper foil layer 134 is then patterned to form a second electrical routing layer. As illustrated in FIG. 2, connections between the first electrical routing layer 115 and the second electrical routing layer 134 can be formed using laser drilling and copper plating to form conductive vias 150 between the layers.

Figure 3:
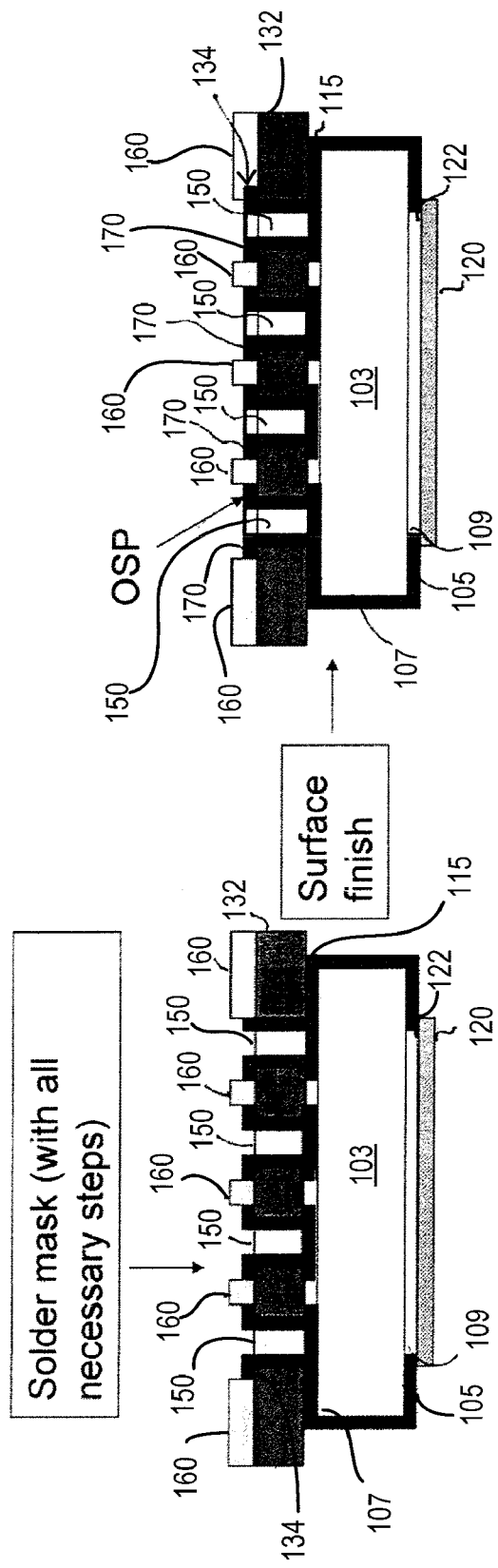
FIG. 3 illustrates formation of a solder mask and application of a surface finish in accordance with one embodiment of the present invention.

FIG. 3 illustrates the formation of a solder mask 160. As illustrated in the right-side of FIG. 3, a surface finish is applied to improve adhesion of solder balls in a subsequent Ball Grid Array (BGA) formation. An exemplary surface finish is an Organic Solder Preservative (OSP). OSP coatings are composed of organometallic polymers that provide corrosion resistance and dissolve completely in a reflow process. An OSP surface finish therefore significantly improves adhesion of solder joints formed between the solder material and copper.

Figure 4:
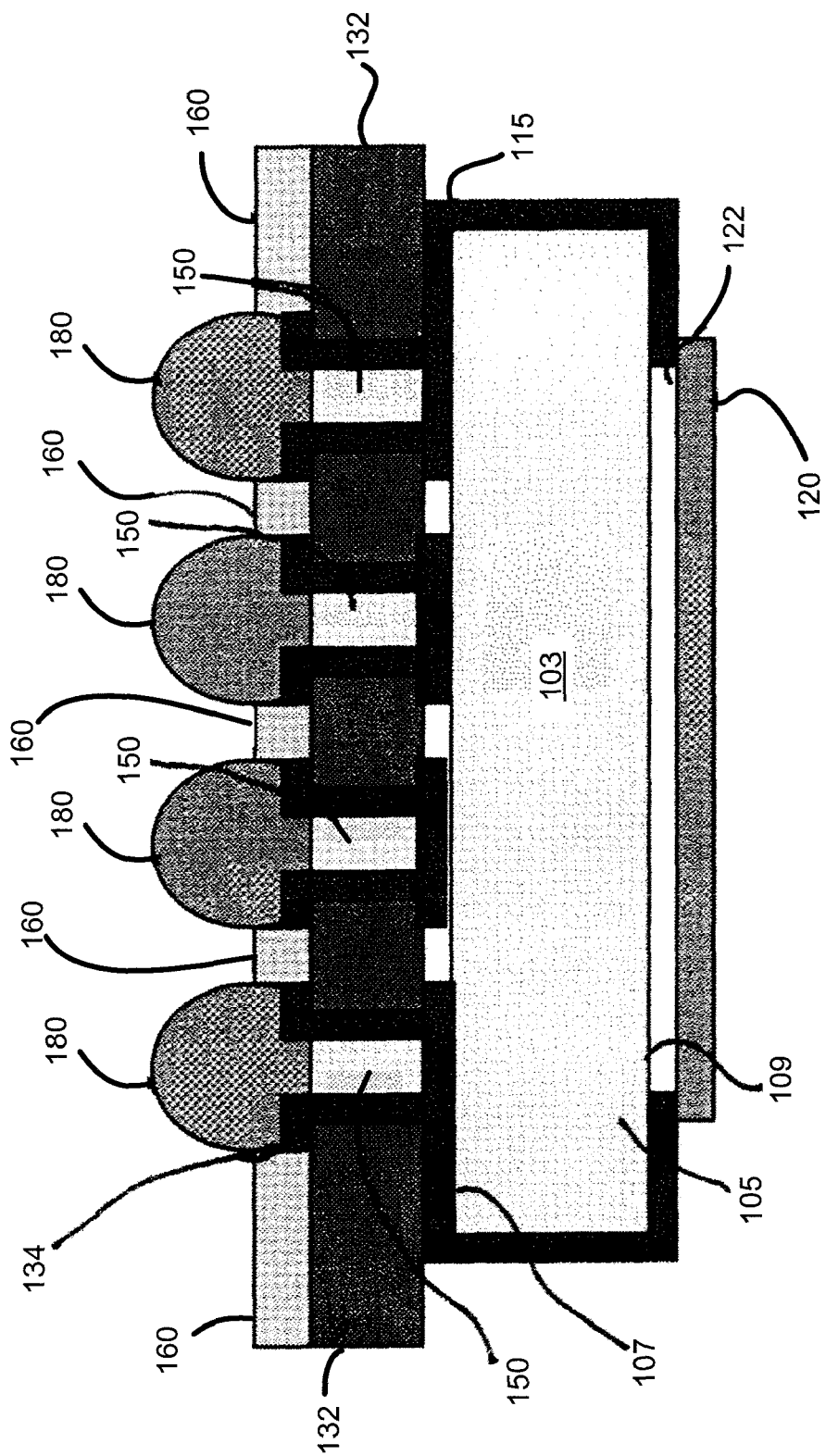
FIG. 4 illustrates formation of a ball grid array on the chip scale package in accordance with one embodiment of the present invention.

FIG. 4 illustrates a BGA formed on open areas not covered by the solder mask 160. BGA array formation may utilize a conventional BGA array formation via reflow. Each solder ball contacts a portion of the second electrical routing layer 134, which is coupled by a via 150 to the first electrical routing layer 115. In an implementation using an OSP surface finish the reliability of the solder joint is improved because the OSP layer disappears during reflow.

The multilayer CSP package of the present invention improves the flexibility of pin-out design. One benefit of the present invention is that it permits a multilayer CSP package to be formed using a reliable and manufacturable process that exploits aspects of RCCFs that were developed in the different field of printed wiring boards. Commercially available RCCFs have excellent adhesion and reliability characteristics. In contrast, many alternative techniques to fabricate a multi-layer CSP, such as using a solder mask between metal layers, have potential reliability and manufacturing problems.

The foregoing description, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications, they thereby enable others skilled in the art to best utilize the invention and various embodiments with various modifications as are suited to the particular use contemplated. It is intended that the following claims and their equivalents define the scope of the invention.

The invention claimed is:
1. A multilayer Chip Scale Package, comprising:
   a first electrical routing layer formed on a first surface of an insulating package base;
   an electrically insulating resin layer formed on the first electrical routing layer;
   a copper foil layer formed on a surface of the electrically insulating resin layer opposed to the first electrical routing layer, the copper foil layer patterned so as to form a second electrical routing layer, the electrically insulating resin layer separating at least a portion of the first electrical routing layer from the second electrical routing layer; and
   a plurality of conductive vias electrically coupling together the first and second electrical routing layers, each of the plurality of conductive vias including a cavity extending at least partially through the electrically insulating resin layer.

2. The multilayer Chip Scale Package of claim 1, further comprising a solder mask formed on the second electrical routing layer for a Ball Grid Array (BGA) solder process.

3. The multilayer Chip Scale Package of claim 1, further comprising an Organic Solder Preservative (OSP) surface finish for a Ball Grid Array (BGA) solder process.

4. The multilayer Chip Scale Package of claim 1, further comprising a silicon wafer formed on a second surface of the insulating package base.

5. The multilayer Chip Scale Package of claim 1, wherein said insulating package base includes a glass layer.

6. The multilayer Chip Scale Package of claim 1, wherein the cavities are plated with a conductive metal.

7. The multilayer Chip Scale Package of claim 1, wherein the cavities are lined with conductive metal from the first electrical routing layer to the second electrical routing layer.

8. The multilayer Chip Scale Package of claim 1, further comprising a plurality of solder balls, each of the plurality of solder balls electrically coupled to the second electrical routing layer and disposed over a respective one of the plurality of conductive vias.

9. The multilayer Chip Scale Package of claim 8, wherein each of the plurality of solder balls contacts a respective gapped contact pad of the second electrical routing layer, each gapped contact pad including two opposing conductive portions separated by a gap.

10. The multilayer Chip Scale Package of claim 8, wherein each of the plurality of solder balls extends at least partially into a respective one of the cavities.

11. The multilayer Chip Scale Package of claim 1, wherein the cavities are plated with copper and arc at least partially filled with solder.

12. The multilayer Chip Scale Package of claim 1, further comprising:
   an additional resin layer formed on the second electrical routing layer; and
   an additional copper foil layer formed on the additional resin layer, the additional copper foil layer patterned so as to form a third electrical routing layer.

* * * * *